United States Patent
Kleine-Hollenhorst et al.

(10) Patent No.: US 9,614,522 B2
(45) Date of Patent: Apr. 4, 2017

(54) OPERATING DEVICE FOR A VEHICLE COMPONENT WITH A FRONT WALL ASSOCIATED WITH A CAPACITATIVE PROXIMITY SENSOR

(71) Applicant: Behrn-Hella Thermocontrol GmbH, Stuttgart (DE)

(72) Inventors: Holger Kleine-Hollenhorst, Lippstadt (DE); Bernd Stich, Buren (DE); Rainer Siebert, Erwitte (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 255 days.

(21) Appl. No.: 14/346,428

(22) PCT Filed: Sep. 18, 2012

(86) PCT No.: PCT/EP2012/068336
§ 371 (c)(1),
(2) Date: Aug. 18, 2014

(87) PCT Pub. No.: WO2013/041520
PCT Pub. Date: Mar. 28, 2013

(65) Prior Publication Data
US 2014/0347301 A1     Nov. 27, 2014

(30) Foreign Application Priority Data

Sep. 22, 2011   (DE) .................. 10 2011 083 235

(51) Int. Cl.
*H03K 17/96*     (2006.01)
*G06F 3/02*      (2006.01)
*G06F 3/044*     (2006.01)

(52) U.S. Cl.
CPC ......... *H03K 17/9622* (2013.01); *G06F 3/044* (2013.01); *G06F 3/0202* (2013.01);
(Continued)

(58) Field of Classification Search
None
See application file for complete search history.

(56) References Cited

U.S. PATENT DOCUMENTS 4,467,401 A  *  8/1984  Siebert .................... H01G 9/08
                                                   361/306.1
4,532,395 A  *  7/1985  Zukowski ............ H01H 13/702
                                                   200/314
(Continued)

FOREIGN PATENT DOCUMENTS

DE     29 721 212 U1     3/1998
DE     201 19 700 U1    11/2001
(Continued)

*Primary Examiner* — Antonio Xavier
(74) *Attorney, Agent, or Firm* — Christensen Fonder Dardi; Peter S. Dardi

(57) ABSTRACT

The operating device, such as a human-machine interface, in particular for a vehicle component, is provided with a front wall having a front side that has several fixed symbol fields and having a rear side, a capacitive sensor system that has individual electrodes associated with the symbol fields, which electrodes are arranged on the rear side of the front wall, and a carrier plate that faces the rear side of the front wall and is arranged at a distance from the front wall.

8 Claims, 2 Drawing Sheets

Figure 1:
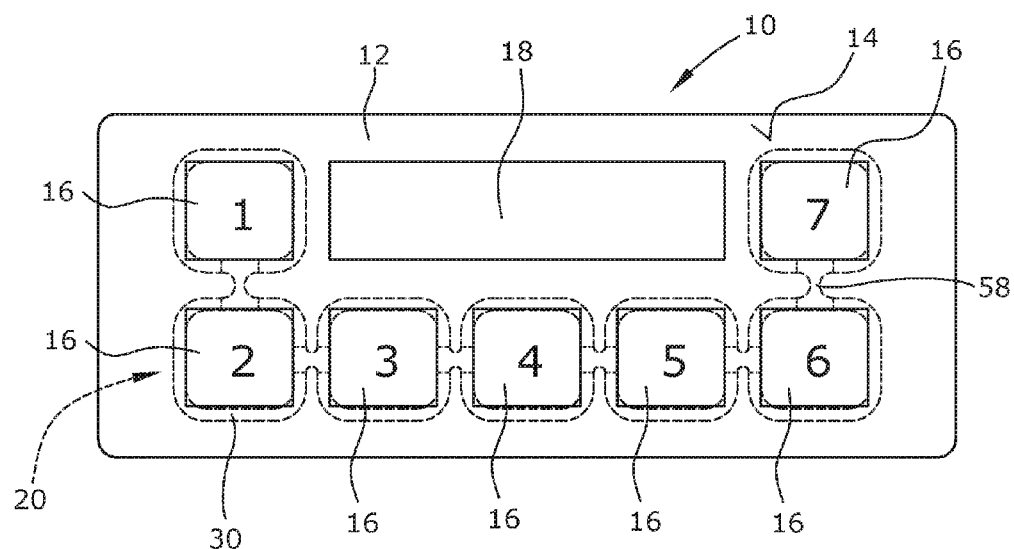

(52) U.S. Cl.
CPC ............... *H03K 2017/9602* (2013.01); *H03K 2217/96076* (2013.01); *H03K 2217/96079* (2013.01)

(56) References Cited

U.S. PATENT DOCUMENTS

| | | | | |
|---|---|---|---|---|
| 5,579,002 | A * | 11/1996 | Iggulden | H03K 17/967 200/5 A |
| 5,917,165 | A * | 6/1999 | Platt | H03K 17/962 200/511 |
| 8,125,461 | B2 * | 2/2012 | Weber | G06F 1/1626 345/170 |
| 8,477,100 | B2 * | 7/2013 | Wang | G06F 3/016 345/168 |
| 2005/0030048 | A1 * | 2/2005 | Bolender | G06F 3/0202 324/661 |
| 2005/0179673 | A1 * | 8/2005 | Philipp | H03K 17/962 345/173 |
| 2005/0206623 | A1 * | 9/2005 | Hein | B60K 37/06 345/173 |
| 2005/0259081 | A1 * | 11/2005 | Sato | G06F 1/1626 345/169 |
| 2006/0180450 | A1 * | 8/2006 | Clark | G06F 3/0202 200/333 |
| 2006/0204303 | A1 * | 9/2006 | Yurochko | G06F 3/0202 400/49 |
| 2007/0242055 | A1 * | 10/2007 | Lai | G06F 3/0412 345/173 |
| 2009/0046065 | A1 * | 2/2009 | Liu | G06F 3/0233 345/168 |
| 2009/0090605 | A1 * | 4/2009 | Arione | H03K 17/962 200/314 |
| 2010/0097346 | A1 * | 4/2010 | Sleeman | G06F 3/0412 345/174 |
| 2010/0117977 | A1 * | 5/2010 | Yoshino | H01J 31/123 345/173 |
| 2010/0302169 | A1 * | 12/2010 | Pance | G06F 3/0237 345/170 |
| 2011/0005845 | A1 * | 1/2011 | Hotelling | G06F 3/044 178/18.06 |
| 2011/0140935 | A1 * | 6/2011 | Anorozo | H03K 17/962 341/33 |
| 2011/0260976 | A1 * | 10/2011 | Larsen | G06F 3/04886 345/168 |
| 2011/0281652 | A1 * | 11/2011 | Laverdiere | G06F 3/0219 463/37 |
| 2013/0126325 | A1 * | 5/2013 | Curtis | H03K 17/9622 200/5 A |

FOREIGN PATENT DOCUMENTS

| | | |
|---|---|---|
| DE | 101 23 633 A1 | 2/2003 |
| DE | 20 2005 002157 U1 | 1/2005 |
| DE | 20 2005 007480 U1 | 1/2005 |
| DE | 103 52 681 A1 | 6/2005 |
| DE | 20 2007 000969 U1 | 4/2007 |
| DE | 10 2006 035837 A1 | 2/2008 |
| DE | 10 2008 029567 A1 | 1/2010 |
| DE | 10 2009 021033 A1 | 1/2010 |
| EP | 1672797 A2 | 6/2006 |
| EP | 1739839 A | 1/2007 |
| EP | 2280484 A1 | 2/2011 |
| EP | 2355356 A1 | 8/2011 |
| WO | 2007 140956 A1 | 12/2007 |
| WO | 2008 006212 A1 | 1/2008 |

* cited by examiner

OPERATING DEVICE FOR A VEHICLE COMPONENT WITH A FRONT WALL ASSOCIATED WITH A CAPACITATIVE PROXIMITY SENSOR

This application is a national stage filing of PCT application PCT/EP2012/068336 to Kleine-Hollenhorst et al., filed Sep. 18, 2012, entitled "Operating Device, Such as a Human-Machine Interface, in Particular for a Vehicle Component, which claims priority to German patent application number 10 2011 083 235.1 filed on Sep. 22, 2011, both of which are incorporated herein by reference.

This invention claims priority of the German patent application 10 2011 083 235.1 of 22 Sep. 2011, the contents of which is hereby incorporated by reference.

The invention relates to an operating device, or generally speaking a human-machine interface, in particular for use with a vehicle component, i. e. an operating device for a human-machine interface of a vehicle component.

For various electric apparatus operating devices for manually setting and changing operating parameters of the apparatus exist. In particular in the automotive sector as well as for other electronic apparatus (PDA, cell phone, tablet computer, palmtops and laptops), for example, it may be advantageous to display a menu for setting options at a display device, for example, if a finger of the hand of the operator approaches the operating device, for example. In this connection it is common practice to use capacitive proximity sensors which comprise electrodes serving for capacitive detection of an object, such as a hand or a finger of a hand, approaching a key, for example. The capacitively acting electrode of such a proximity sensor should be arranged as closely as possible to the front side and/or the front side of a key body to be capable of reliably detecting the approach of an object. An example of an actuating key having a capacitive proximity sensor arranged therein is described in DE-A-10 2006 035 837. Here, the electrode is configured as a helical spring element abutting on the inside of the front wall of the key body.

Further examples of operating elements having a proximity sensor system where the proximity sensor is arranged inside a key body adapted to be depressed are described in DE-A-10 2007 025 564 and EP-A-1 739 839. In the examples described in these specifications the sensor system has an effect on the force required for depressing the keys. In addition, another problem with the previously known keys having a capacitive sensor system is that backlighting of the key body and/or its front wall is possible to a restricted extent only since the built-in components in the form of a proximity sensor system entail restrictions with regard to a uniform illumination of the key body.

Further, it is known from DE-U-20 2005 002 157 to realize in a manually operable fixed touch pad (touch screen or panel) a capacitive proximity sensor system by arranging a helical electrically conducting spring expanding towards the touch pad between the fixed touch pad and a carrier plate disposed in spaced relationship below the touch pad, the spring being arranged in a compressed state between the touch pad and the carrier plate and forming the capacitive electrode of the proximity sensor.

In DE-A-10 2008 029 567 a back-lit capacitive proximity sensor is described where electric conductors extend from a circuit board carrying the backlighting light source to the rear side of the front wall of a housing. At the rear side these electric conductors contact a conductive capacity-forming sensor layer which is arranged behind the front wall. Thus there is an electrical connection between the electric conductors and the capacity-forming sensor layer. Due to external influences the electrical contacting between the electric conductors and the sensor layer may deteriorate in the course of time such that the overall assembly may show poorer properties.

Another sensor device is described in DE-U-201 19 700, while DE-A-103 52 681 describes an operating device for operating an electric apparatus having a touch sensor. A sensor element responding to a touch is exemplarily described in DE-A-101 23 633. DE-U-20 2007 000 969 describes a sensor element for a capacitive touch switch as well as an operating means. A touch switch having a sensor key is disclosed in DE-U-29 721 212. Finally, DE-U-20 2005 007 480 describes a touch-sensitive operating panel of an electric apparatus.

The known capacitive proximity sensor system may require an increased assembly effort.

It is an object of the invention to provide an operating device having a capacitive proximity sensor system where both the design work and the assembly effort are reduced.

To achieved this object the invention proposes an operating device, or generally speaking a human-machine interface, in particular for a vehicle component, wherein the operating device is provided with

- a front wall with a front side including a plurality of fixed symbol fields and with a rear side,
- a capacitive proximity sensor system including individual electrodes associated with the symbol fields, the electrodes being arranged at the rear side of the front wall, and
- a carrier plate facing the rear side of the front wall, the carrier plate being arranged in spaced relationship to the front wall,
- wherein the capacitive proximity sensor system includes an evaluating unit connected with the electrodes for identifying that symbol field which is approached by an object, in particular a hand or a finger of a hand.

According to the invention, the operating device provides for

- electrode carrier elements associated with the individual symbol fields to be arranged between the front wall and the carrier plate,
- each electrode carrier element to include an electrode end facing the rear side of the front wall, the electrode end being provided with an electrode, and an opposite contact end electrically contacting a contact field of the carrier plate electrically connected with the evaluating unit, and
- the electrode end of each electrode carrier element to include a protruding contact edge extending at least partially around the symbol field associated with the electrode carrier element and abutting on the rear side of the front wall,
- wherein the electrode is formed along the contact edge of the electrode carrier element without being electrically connected to the front wall, and
- wherein each electrode carrier element includes an electrically conducting area for electrical connection of its electrode with its contact end and thus with the contact field of the carrier plate.

The operating device according to the invention is provided with a front wall comprising a plurality of fixed symbol fields at a front side. Besides these fixed symbol fields the front side may be provided with movable operating elements (rotary knobs, push buttons, sliding switches, rocker switches).

Further, the operating device comprises a capacitive proximity sensor system including electrodes which are electrically connected with an evaluating unit. The electrodes are located near the symbol fields and are respectively associated therewith. The electrodes are arranged at the rear side of the front wall without necessarily being fixedly connected with the front wall. The evaluating unit is typically located at a carrier plate which is normally configured in the form of a circuit board and comprises corresponding mechanical and/or electric/electronic components. With the aid of the electrodes arranged near the symbol fields a change in the capacity of the electrodes and/or a fault in the electrical fields around the electrodes can be detected when an object, in particular the hand or the fingers of a hand of a person, approaches one of the symbol fields. Thus this symbol field can be identified to then display information at a display element of the operating device, for example, which information is associated with the function adapted to be selected and/or set via the respective symbol field.

The operating device according to the invention comprises electrode carrier elements associated with the individual symbol fields, the electrode carrier elements being arranged between the front wall and the carrier plate. These electrode carrier elements are configured as essentially rigid elements made of a plastic material, for example. These electrode carrier elements carry the respective electrodes which are arranged at the (electrode) end of the electrode carrier elements facing the rear side of the front wall. The end of an electrode carrier opposite an electrode end is configured as a contact end which abuts on a contact field of the carrier plate thus producing an electrical contact, the contact field, in turn, being connected with the evaluating unit via a conductive path or similar electric conductors. The electrode end of each electrode carrier element is configured as a protruding contact edge which at least partially extends around the symbol field with which the electrode end is associated. Appropriately, the contact edge extends circumferentially around the symbol field and is a closed edge. The electrode extends along the contact edge, namely at least partially across a portion thereof. The electrode is electrically connected with the contact end of the electrode carrier element such that the latter carries a corresponding electric conductor.

The capacitive proximity sensor system of the operating device according to the invention thus comprises a compact and easy-to-install electrode assembly and/or holder in the form of the electrode carrier elements. Each electrode carrier element includes at least one electrode, the electric conductor(s) between the respective electrode and the contact end of the electrode carrier element as well as an electrically conducting area at the contact end for electrically contacting a contact field of the carrier plate. A plurality of electrode carrier elements can be combined to form a single piece such that a common electrode carrier element having a plurality of electrode ends and/or electrodes electrically insulated from each other is formed, the electrode ends and/or electrodes being respectively connected via separate conductors with contact areas of the electrode carrier elements electrically insulated from each other, which, on their part, are in electrical contact with the carrier plate.

According to a preferred aspect of the invention, each electrode carrier element comprises an electrically insulating carrier material, and an electrically conducting material for the electrode, the electric conductor and the contact end of the electrode carrier element is embedded in its carrier material and/or applied to its carrier material. The electrically conducting areas of the electrically insulating carrier material for the electrode carrier elements can be produced by MID (molded interconnect device) or LDS (laser direct structuring) techniques, by galvanization, metallization or varnishing with electrically conducting material. It is also possible to configure the electrode carrier elements as 2-component plastic elements, namely of an electrically insulating plastic component and of an electrically conducting plastic component.

According to a further embodiment of the invention, at least one spring arm integrally formed with the electrode carrier element and elastically abutting on the carrier plate is arranged at the contact end of each electrode carrier element as a protection against rattling as well as for ensuring reliable electric contacting of the electrode carrier elements at the carrier plate. The resilient abutting of each electrode carrier element on the rear side of the front wall, as realized by the spring arm, is also advantageous with regard to tolerance compensation.

A plurality of spring arms per electrode carrier element may be provided. At least one of these spring arms should make the electrical contact with the contact field of the carrier plate.

According to another preferred aspect of the invention, the electrode carrier elements may comprise a hollow space extending between the carrier plate and the front wall, which hollow space can be used for backlighting function of the symbol fields. With each electrode carrier element a backlighting light source at the carrier plate is appropriately associated, whose light illuminates the area behind a symbol field through the hollow space. The electrode carrier elements of adjacent symbol fields prevent scattered light from exiting/entering. According to the aspect of the invention described above, at least one or a plurality of electrode carrier elements is/are thus respectively traversed by a hollow space extending up to the electrode and contact ends of the respective electrode carrier element, and the contact ends of each electrode carrier element abut on the rear side of the front wall and/or the carrier plate via a circumferential edge, and a backlighting light source for backlighting the symbol field associated with the electrode carrier element is arranged at the carrier plate in the area enclosed by the contact edge of the electrode carrier element.

Instead of a (partial) varnishing or other application of electrically conducting material to the electrode carrier element, another aspect of the invention preferably provides for each electrode carrier element to be configured as a two-component part, in particular an injection molded part, wherein the one component is an electrically insulating plastic material and the other component is an electrically conductive plastic material of which the areas of the electrode carrier element forming the electrode and its electrical connection and contacting to the carrier plate are made.

As briefly described above, a plurality of electrode carrier elements may be integrally formed thus forming a common electrode carrier element for a plurality of adjacent and/or all symbol fields of an operating device. When the electrode carrier elements are configured as a 2-component part, the connecting areas 58 between two respective electrode carrier elements 20 are made of the electrically insulating plastic material 56.

Figure 2:
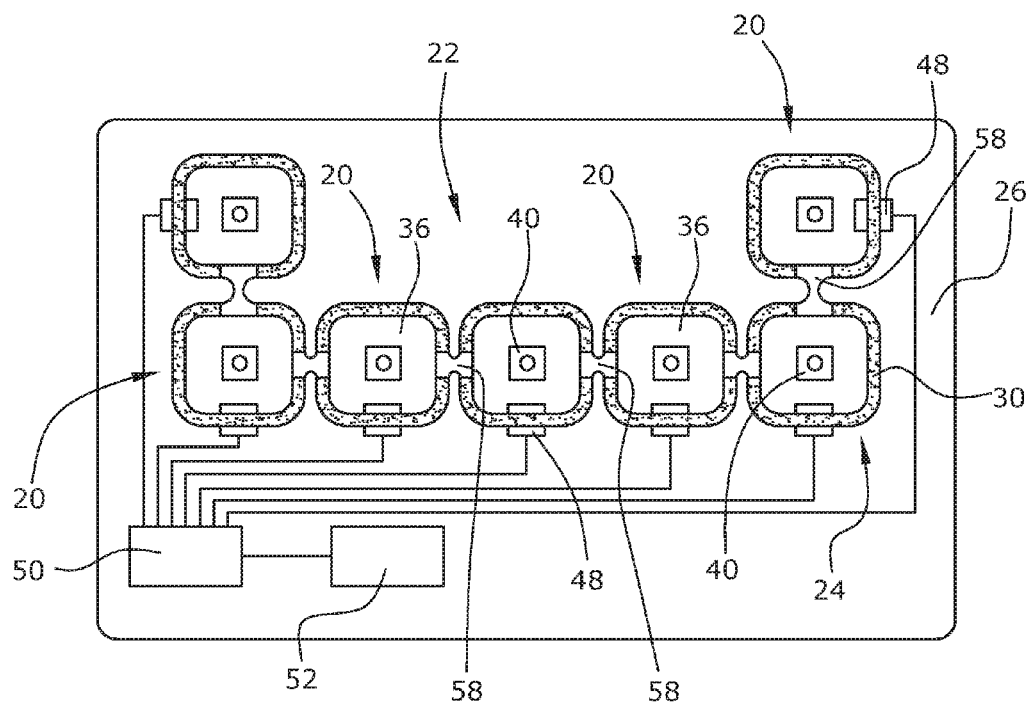
Figure 3:
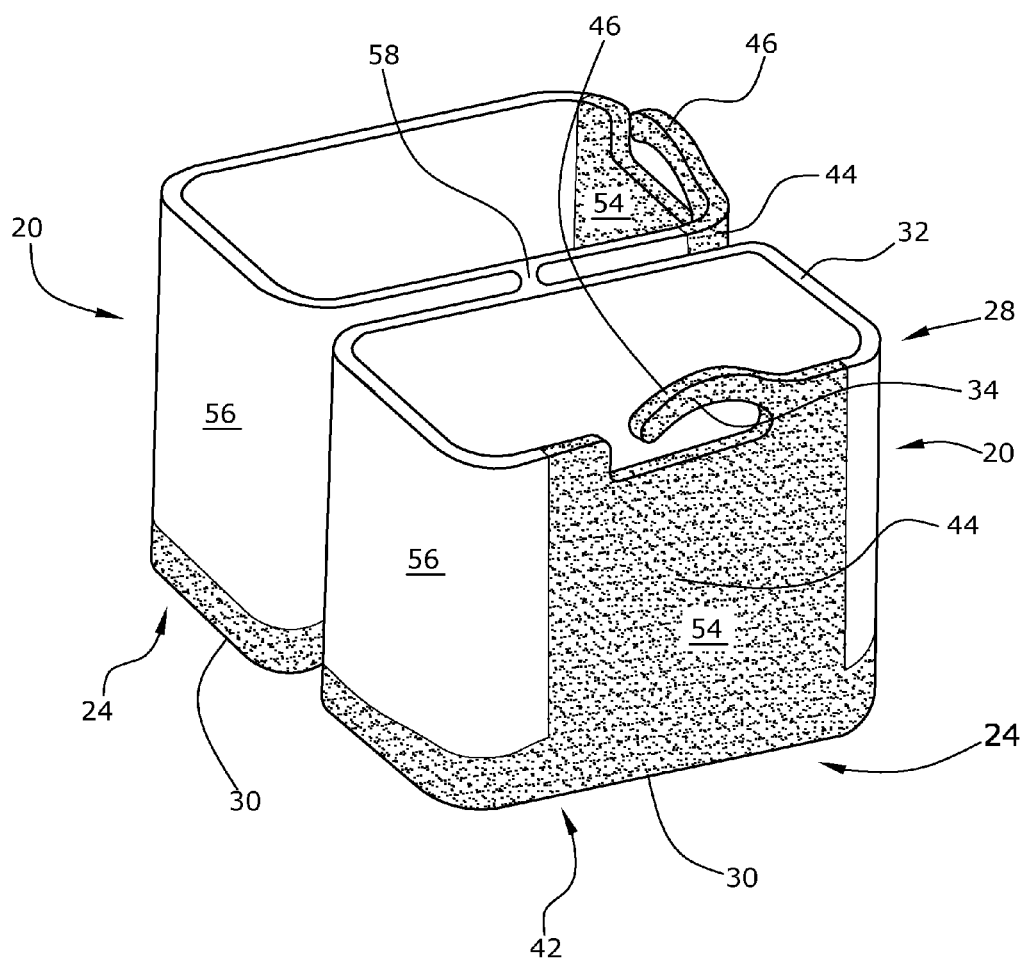

Hereunder the invention is explained in detail on the basis of an exemplary embodiment and with reference to the drawings in which:

FIG. 1 shows a top view of the front side of the front wall of an operating device, FIG. 2 shows a view of the operating device with the front wall removed, and FIG. 3 shows a perspective partial view of the rear side of the front wall with electrode carrier elements arranged in front thereof.

FIG. 1 shows a front view of an operating device 10 having a front wall 12 at whose front side 14 a plurality (seven in the exemplary embodiment) of fixed symbol fields 16 are arranged. Further, the operating device 10 comprises a display 18 at its front wall 12.

The operating device 10 is provided with a capacitive proximity sensor system for each symbol field 16. This capacitive proximity sensor system allows an approach of a finger of a hand of a person operating the operating device 10, for example, to be detected, and thus the respective symbol field approached by the finger to be identified. For this purpose the operating device 10 comprises a plurality of electrode carrier elements 20 which are associated with the individual symbol fields 16 and are integrally connected with each other thus forming a common carrier element 22 in this exemplary embodiment. The configuration of the carrier element 22 can be seen in FIGS. 2 and 3.

Each electrode carrier element 20 comprises an electrode end 24 facing the front wall 12 and an opposite contact end 28 facing a carrier plate 26. The electrode end 24 is connected with a contact edge 30 which is a circumferential uninterrupted contact edge 30 in this exemplary embodiment and extends around a symbol field 16. At their contact ends 28 the electrode carrier elements 20 also comprise contact edges 32. Along these latter contact edges 32 each electrode carrier element 20 is provided with a spring arm 34 which protrudes beyond the contact edge 32, as shown in FIG. 3, for example.

As can be seen in FIGS. 2 and 3, each electrode carrier element 20 is configured in the form of a channel or a duct and comprises a hollow space 36 extending from the contact end 28 up to the electrode end 24 of an electrode carrier element 20. The overall assembly of the electrode carrier elements 20, i. e. the common carrier element 22, abuts on the carrier plate 26, namely with the contact ends 28 of the electrode carrier elements 20. The contact edges 30 at the electrode ends 24 of the electrode carrier elements 20 abut on the rear side 38 of the front wall 12, as can be seen in FIGS. 1 and 3, for example. The respective contact edges of the electrode carrier elements 20 thus terminate at the carrier plate 26 on the one hand and at the front wall 12 on the other hand such that the light from the backlighting light sources 40 which are arranged at the carrier plate 26 inside the hollow spaces 36, as shown in FIG. 2, for example, can be used for backlighting the respective symbol fields 16 without scattered light and the like being allowed to exit.

The electrode carrier elements 20 comprise a plastic material which is electrically insulating. At the individual electrode carrier elements 20 electrically conducting electrodes 42 are formed which extend along the respective contact edges 30 and thus along the rear side 38 of the front wall 12 and around the symbol fields 16. The electrically conducting electrodes 42 are produced by corresponding varnishing of the plastic electrode carrier elements 20 with an electrically conducting material. From the electrically conducting areas of the electrodes 42 of the common carrier element 22 electrically conducting areas 44 per electrode carrier element extend up to the contact ends 28. At the contact ends 28 of the electrode carrier elements 20 at least the areas of the integrated spring arms 34 are provided with an electrically conducting material, as is shown at 46 in FIG. 3. As can be seen, an electrically conducting material is provided at the surfaces of the spring arms 34 facing the carrier plate 26. In these areas the spring arms 34 abut on the contact fields 48 of the carrier plate 26 which are connected in an electrically conducting manner with an evaluating unit indicated at 50. In the evaluating unit the approach of a finger, for example, approaching a symbol field 16 is detected on the basis of the change in the capacity of the electrodes 42 and/or on the basis of a change in the electrical fields around the electrodes 42. Thus the symbol field 16 is adapted to be identified. The evaluating unit 50 may then output to a display control unit 52, for example, a corresponding signal for controlling the display 18 for the purpose of visual information indication.

Alternatively to a partial varnishing of the electrode carrier element 20 with an electrically conductive material (and/or partial application of such a material in a different manner), the electrode carrier element 20 may also be configured as an injection molded 2-component plastic part. Here, the electrode carrier element 20 is made of an electrically conductive (e. g. due to additives) plastic material 54 in those areas where the electrode 42 and its electrically conducting (connecting) area 44 as well as the carrier plate contact field contacting end 46 are located, while the remaining area of the electrode carrier element 20 is made of an electrically insulating plastic material 56. The (e. g. web-like) connecting areas 58 of adjacent electrode carrier elements 20 are also made of the electrically insulating plastic material 56 for the purpose of insulating adjacent electrodes 42.

LIST OF REFERENCE NUMERALS

10 Operating device
12 Front wall of the operating device
14 Front side of the front wall
16 Symbol fields at the front wall
18 Display of the operating device
20 Electrode carrier elements of the proximity sensor system
22 Common carrier element
24 Electrode end
26 Carrier plate
28 Contact end
30 Contact edge at the electrode end
32 Contact edge at the contact end
34 Spring arm of the electrode carrier element
36 Hollow space of the electrode carrier element
38 Rear side of the front wall
40 Backlighting light source
42 Electrodes of the proximity sensor system
44 Electrically conducting area
46 Contacting end
48 Contact fields at the carrier plate
40 Evaluating unit of the proximity sensor system
52 Display control unit
54 Electrically conductive plastic material
56 Electrically insulating plastic material
58 Connecting area between two adjacent electrode carrier elements

The invention claimed is:
1. An interface component, comprising
a front wall with a front side including a plurality of fixed symbol fields and with a rear side,
individual electrodes associated with the symbol fields, which electrodes are arranged at the rear side of the front wall, and
a carrier plate facing the rear side of the front wall, which carrier plate is arranged in spaced relationship to the front wall, wherein
between the front wall and the carrier plate, carrier elements associated with the individual symbol fields are arranged,
each carrier element includes an electrode end facing the rear side of the front wall, which electrode end is provided with an associated one of the individual electrodes, and an opposite contact end electrically contacting a contact field of the carrier plate, and
the electrode end of each carrier element includes a protruding contact edge extending at least partially around the symbol field associated with the carrier element and abutting on the rear side of the front wall,
wherein each of the associated electrodes extends from the contact edge of the carrier element to the electrode end, and
wherein each carrier element includes an electrically conducting area providing electrical connection of the contact edge with the contact field of the carrier plate.

2. The interface component according to claim 1, wherein each carrier element comprises an electrically insulating carrier material, and wherein an electrically conducting material for the associated electrode and for both the electrically conducting area and the contact end of the carrier element is embedded in its carrier material and/or is applied to its carrier material.

3. The interface component according to claim 1, wherein at the contact end of each carrier element at least one spring arm integrally formed with the carrier element is arranged in a manner elastically abutting on the carrier plate.

4. The interface component according to claim 3, wherein the spring arm or at least one of the spring arms is electrically conducting and abuts on a contact field of the carrier plate.

5. The interface component according to claim 1 wherein at least one or a plurality of carrier elements is/are traversed by a respective hollow space extending up to the associated electrode and contact ends of the respective carrier element, and wherein the contact ends of each carrier element abut on the rear side of the front wall and/or the carrier plate via a circumferential contact edge, and wherein a backlighting light source for backlighting the symbol field associated with the carrier element is arranged at the carrier plate in the area enclosed by the contact edge of the carrier element.

6. The interface component according to claim 1, wherein at least two carrier elements associated with adjacent symbol fields are integrally formed, wherein their associated electrodes with the electrically conducting areas and contact ends associated therewith are respectively electrically insulated from each other.

7. The interface component according to claim 6, wherein the connecting area between two respective carrier elements are made of the electrically insulating plastic material.

8. The interface component according to claim 1, wherein each carrier element is configured as a two-component part, in particular an injection molded part, wherein the one component is an electrically insulating plastic material and the other component is an electrically conductive plastic material of which the areas of the carrier element forming the associated electrode and its electrical connection and contacting to the carrier plate are made.

* * * * *